(12) United States Patent
Queens et al.

(10) Patent No.: US 10,503,087 B2
(45) Date of Patent: Dec. 10, 2019

(54) METHODS FOR CONTROLLING LITHOGRAPHIC APPARATUS, LITHOGRAPHIC APPARATUS AND DEVICE MANUFACTURING METHOD

(71) Applicant: ASML NETHERLANDS B.V., Veldhoven (NL)

(72) Inventors: Rene Marinus Gerardus Johan Queens, Boise, ID (US); Arend Johannes Donkerbroek, Aarle-Rixtel (NL); Pietro Andricciola, Waarle (NL); Ewoud Frank Van West, Boise, ID (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/752,658

(22) PCT Filed: Aug. 23, 2016

(86) PCT No.: PCT/EP2016/069858
§ 371 (c)(1),
(2) Date: Feb. 14, 2018

(87) PCT Pub. No.: WO2017/045871
PCT Pub. Date: Mar. 23, 2017

(65) Prior Publication Data
US 2018/0239267 A1    Aug. 23, 2018

(30) Foreign Application Priority Data
Sep. 15, 2015 (EP) ..................... 15185333

(51) Int. Cl.
*G03F 7/20* (2006.01)
*G03F 9/00* (2006.01)

(52) U.S. Cl.
CPC .......... *G03F 9/7026* (2013.01); *G03F 9/7019* (2013.01); *G03F 9/7034* (2013.01);
(Continued)

(58) Field of Classification Search
CPC .. G03F 7/70641; G03F 9/7019; G03F 9/7026; G03F 9/7034; G03F 9/7049; G03F 9/7057; G03F 9/7088; G03F 9/7092
(Continued)

(56) References Cited

U.S. PATENT DOCUMENTS

| 5,748,323 A | 5/1998 | Levinson |
| 7,113,257 B2 | 9/2006 | Brinkhof et al. |

(Continued)

FOREIGN PATENT DOCUMENTS

| CN | 1918518 | 2/2007 |
| CN | 101533228 | 9/2009 |

(Continued)

OTHER PUBLICATIONS

International Search Report and Written Opinion dated Nov. 25, 2016 in corresponding International Patent Application No. PCT/EP2016/069858.
(Continued)

*Primary Examiner* — Colin W Kreutzer
(74) *Attorney, Agent, or Firm* — Pillsbury Winthrop Shaw Pittman LLP

(57) ABSTRACT

A lithographic apparatus uses a height sensor to obtain height sensor data representing a topographical variation across a substrate. The height sensor data is used to control focusing of a device pattern at multiple locations across the substrate. A controller identifies one or more first areas where height sensor data is judged to be reliable and one or more second areas where the height sensor data is judged to be less reliable. Substitute height data is calculated for the
(Continued)

second areas using height sensor data for the first areas together with prior knowledge of expected device-specific topography. The focusing of the lithographic apparatus is controlled using a combination of the height data from the sensor and the substitute height data.

20 Claims, 8 Drawing Sheets

(52) U.S. Cl.
CPC .......... *G03F 9/7049* (2013.01); *G03F 9/7088* (2013.01); *G03F 9/7092* (2013.01); *G03F 9/7057* (2013.01)

(58) Field of Classification Search
USPC .............................. 355/68, 77; 356/609, 624
See application file for complete search history.

(56) References Cited

U.S. PATENT DOCUMENTS

| 7,265,364 | B2 | 9/2007 | Teunissen et al. |
| 7,746,484 | B2 | 6/2010 | Van De Vin et al. |
| 8,643,847 | B1 | 2/2014 | Chen |
| 8,842,293 | B2 | 9/2014 | Den Boef et al. |
| 8,842,296 | B2 | 9/2014 | Sogard et al. |
| 9,488,465 | B2 | 11/2016 | Khuat Duy et al. |
| 2005/0134816 | A1 | 6/2005 | Modderman et al. |
| 2009/0231563 | A1 | 9/2009 | Staals et al. |
| 2009/0262320 | A1 | 10/2009 | Staals et al. |
| 2010/0233600 | A1 | 9/2010 | Den Boef et al. |
| 2013/0128247 | A1 | 5/2013 | Khuat Duy et al. |
| 2014/0343893 | A1* | 11/2014 | Mansfield ............ G01B 11/303 702/167 |
| 2016/0103443 | A1* | 4/2016 | Bryll ...................... G05B 19/21 700/114 |
| 2016/0334712 | A1 | 11/2016 | Cekli et al. |
| 2016/0370711 | A1* | 12/2016 | Schmitt-Weaver ........................ G03F 7/70725 |

FOREIGN PATENT DOCUMENTS

| TW | 201527895 | 7/2015 | |
| WO | 2015/104074 | 7/2015 | |
| WO | 2015/131969 | 9/2015 | |
| WO | WO-2015131969 A1 * | 9/2015 | ......... G03F 7/70725 |

OTHER PUBLICATIONS

Chinese Office Action issued in corresponding Chinese Patent Application No. 201680053392.5, dated Aug. 28, 2019.

* cited by examiner

METHODS FOR CONTROLLING LITHOGRAPHIC APPARATUS, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2016/069858, which was filed on Aug. 23, 2016, which claims the benefit of priority of European patent application no. 15185333.0, which was filed on Sep. 15, 2015, and which is incorporated herein in its entirety by reference.

BACKGROUND

Field of the Invention

The present disclosure relates to lithographic apparatus. The disclosure relates in particular to the control of lithographic apparatus using data from height sensors. The disclosure further relates to methods of manufacturing devices by lithography, and to data processing apparatuses and computer program products for implementing parts of such apparatus and methods.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a grid of adjacent target portions referred to as "fields" that are successively patterned. Known lithographic apparatus include so-called steppers, in which each field is irradiated by exposing an entire field pattern onto the field at one time, and so-called scanners, in which each field is irradiated by scanning the field pattern through a radiation beam in a given direction (the "scanning"-direction) while synchronously scanning the substrate parallel or anti-parallel to this direction.

The pattern is imaged onto the target portion of the substrate using lenses (or mirrors) forming a projection system. When imaging the pattern onto the substrate it is desirable to ensure that an uppermost surface of the substrate (i.e. the surface onto which the pattern is to be imaged) lies within the focal plane of the projection system.

The surface of a substrate on which a pattern should be projected is never perfectly flat, but presents many height deviations on both a large scale and smaller scale. Failure to adjust the focus of the projection system may result in poor patterning performance and consequently poor performance of the manufacturing process as a whole. Performance parameters such as critical dimension (CD) and CD uniformity in particular will be degraded by poor focus.

To measure these height deviations, height sensors are normally integrated in the lithographic apparatus. These are typically optical sensors used to measure the vertical position of the uppermost surface of the substrate at points all across the substrate, after it has been loaded into the lithographic apparatus. This set of measurements is stored in some suitable form and may be referred to as a "height map". The height map is then used when controlling imaging of the pattern onto the substrate, to ensure that the radiation sensitive resist layer on each portion of the substrate lies in the focal plane of the projection lens. Typically the height of a substrate support bearing the substrate will be adjusted continuously during exposure of successive portions on a substrate. Examples of height sensors are disclosed in U.S. Pat. No. 7,265,364 B2, US 20100233600 A1 and US 2013128247 A, all incorporated herein by reference. These height sensors do not need to be described in detail herein.

The present disclosure concerns problems that arise when the substrate is subject to device-specific variations in process dependency. Modern device types such as 3-D NAND memory devices may in fact have real topographical variations within the device pattern. Even where there is little or no actual topographic variation, however, differences in optical properties of materials used at different parts of the device can lead to a large apparent topographical variation, when read by the height sensor. This is referred to as process dependency of the sensor. In practice, these apparent variations caused by process dependency of the height sensor can be much greater in amplitude than the real topography variations.

Corrections to the height map may be made using other sensor measurements (for example an air gauge) to reduce process dependency of the measurements. According to published international patent application WO2015/131969, incorporated herein by reference, further corrections can be applied to the height map based on prior knowledge of product design and process dependency. This allows a different calibration to be applied to obtain height data from the sensor signals, according to the different material properties expected to exist at different locations. An additional problem arises, however, in that the effect of process dependency can vary significantly across the substrate. Consequently, when calibrating the process dependency errors for a given field, or for an average field, this correction may not be effective on all fields. An inter-field process dependency component remains.

SUMMARY OF THE INVENTION

It is desirable to improve performance of lithographic manufacturing processes in the presence of device-specific topography with varying process dependency.

The invention in a first aspect provides a method of controlling a lithographic apparatus to manufacture a plurality of devices on a substrate, the method comprising:

(a) using a height sensor to obtain height sensor data representing a topographical variation across the substrate; and (b) using the height sensor data to control a positioning system of the lithographic apparatus for applying a device pattern at multiple locations across the substrate wherein step (b) comprises:

(b1) identifying one or more first areas where height sensor data is judged to be reliable and one or more second areas where the height sensor data is judged to be less reliable;

(b2) calculating substitute height data for the second areas using height sensor data for the first areas together with prior knowledge of expected device-specific topography, and (b3) controlling the lithographic apparatus using a combination of the height data from the sensor and the substitute height data.

The invention further provides a lithographic apparatus comprising a projection system and positioning system for positioning a patterning device and substrate in relation to the projection system for applying a pattern to a substrate, the lithographic apparatus including:

a height sensor for obtaining height sensor data representing a topographical variation across the substrate; and a controller for using the height sensor data to control said positioning system, wherein said controller is arranged (i) to identify one or more first areas where height sensor data is judged to be reliable and one or more second areas where the height sensor data is judged to be less reliable (ii) to calculate substitute height data for the second areas using height sensor data for the first areas together with prior knowledge of expected device-specific topography, and (iii) to use a combination of the height data from the sensor and the substitute height data when controlling said positioning system. In accordance with the above aspects of the present disclosure, a focus control method can be implemented that has a correct response to device-specific topography, despite variations in process dependency income portions of the device areas.

In some embodiments, the first areas and second areas are identified at least partly using knowledge of a product layout. Alternatively or in addition, the first areas and second areas are identified at least partly using measurements made on prior substrates.

The first areas may be referred to as anchor areas. When reliable prior knowledge of device-specific topography is combined with reliable height sensor data for the anchor areas, substitute height data can be calculated for the other areas, that is more reliable than height sensor data. The prior knowledge of expected device-specific topography can be obtained from measurement of prior processed substrates, using reliable metrology tools. These reliable metrology tools need not have the same throughput as the height sensor used in high volume manufacturing.

In some embodiments, the prior knowledge specifies a height difference between a first area and a neighboring second area. First areas and second areas are only presented as examples. Third areas, fourth areas and so on can be defined, if several different types of process dependency are present in the one device layout. The anchor areas (first areas) for the third areas need not be the same as the first areas for the second areas, or they may be the same.

The substitute height data for one second area may be calculated for example using the specified height difference together with height sensor data for one or more first areas immediately neighboring the second area.

The substitute height data for one second area may be calculated using the specified height difference together with a height model calculated from height sensor data for a plurality of first areas and not only first areas immediately neighboring the second area.

For cases where the first areas are smaller than a spatial resolution of the height sensor, height sensor data for a first area can be enhanced by deconvolution with a height sensor response function, prior to being used to calculate the substitute height data for a second area.

The invention yet further provides a computer program product comprising machine readable instructions for causing a general purpose data processing apparatus to perform the steps of the method according to the invention as set forth above.

The invention yet further provides a computer program product comprising machine readable instructions for causing a general purpose data processing apparatus to implement the controller of a lithographic apparatus according to the invention as set forth above.

The computer program product in either case may comprises a non-transitory storage medium.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Figure 1:
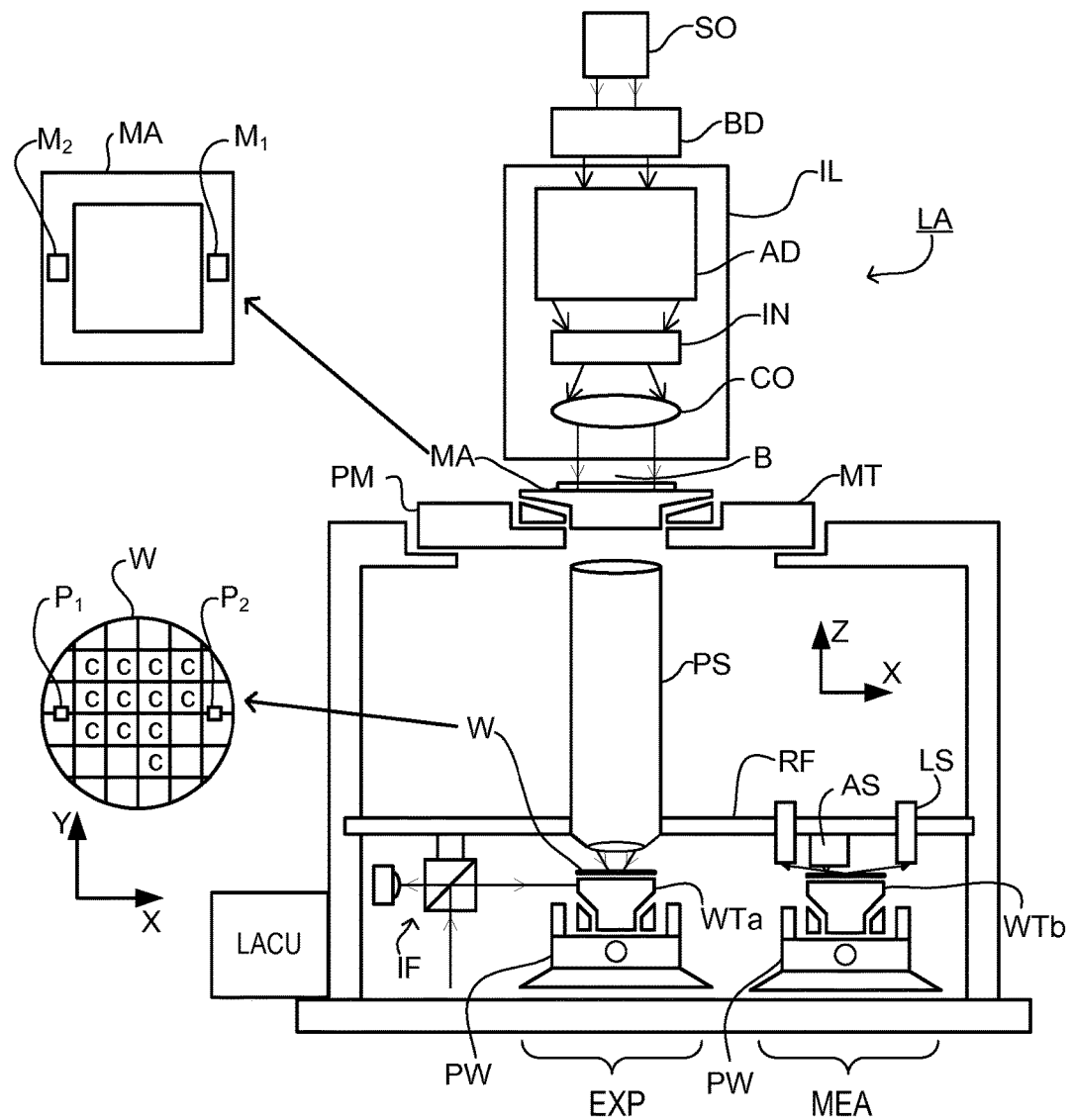
FIG. 1 depicts a lithographic apparatus according to an embodiment of the invention.

FIG. 1 schematically depicts a lithographic apparatus LA. The apparatus comprises:

an illumination system (illuminator) IL configured to condition a radiation beam B (e.g. UV radiation or EUV radiation).

a support structure (e.g. a mask table) MT constructed to support a patterning device (e.g. a mask or reticle) MA and connected to a first positioner PM configured to accurately position the patterning device in accordance with certain parameters;

a substrate table (e.g. a wafer table) WTa or WTb constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device (or a number of devices) being created in the target portion, such as an integrated circuit. The patterning device may be transmissive or reflective. Examples of patterning devices include masks, programmable mirror arrays, and programmable LCD panels.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (fields), and/or between device areas (dies) within target portions. These are known as scribe-lane alignment marks, because individual product dies will eventually be cut from one another by scribing along these lines. Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface height of the substrate using a height sensor LS and measuring the position of alignment marks on the substrate using an alignment sensor AS. The measurement is time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
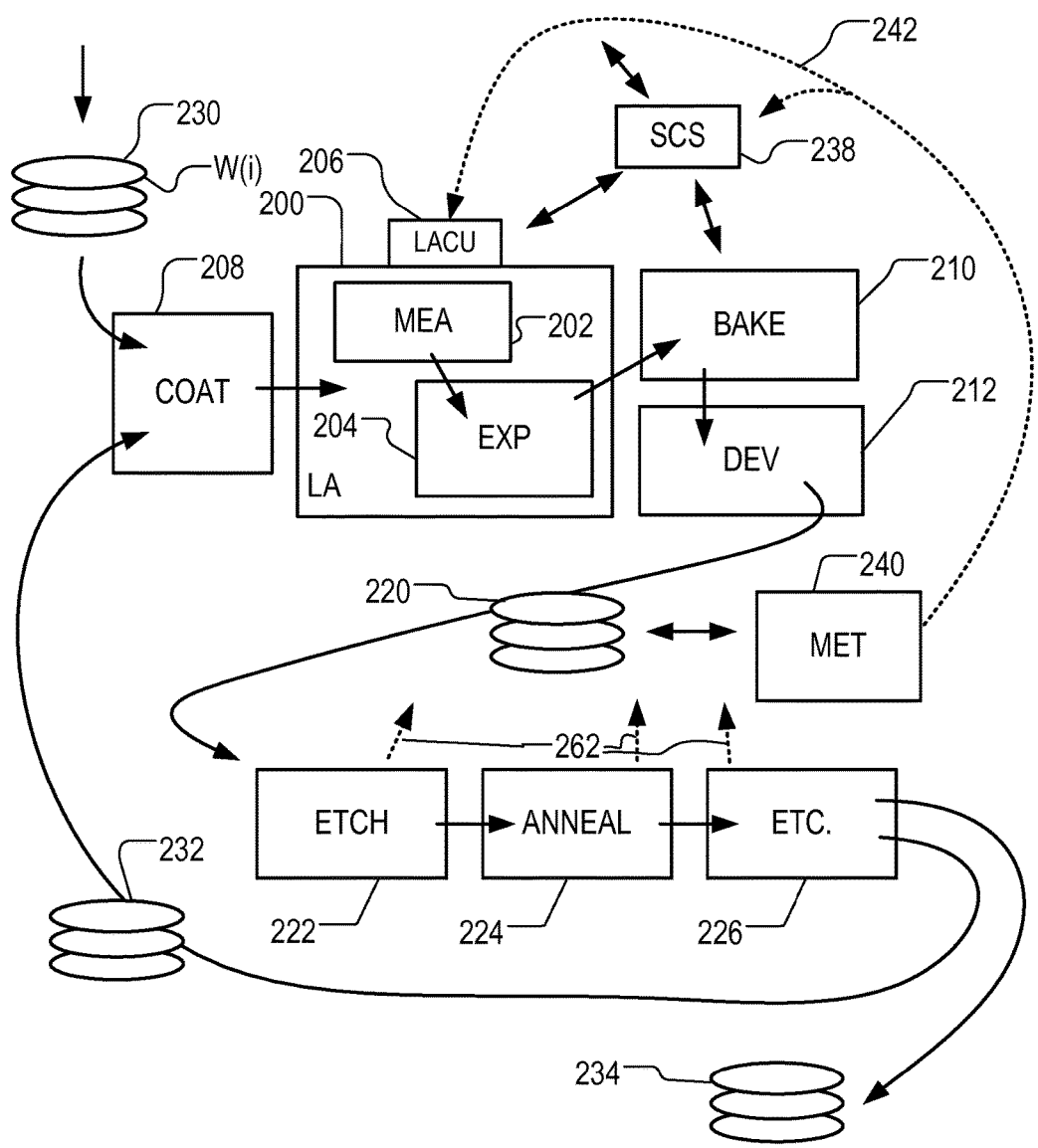
FIG. 2 shows schematically the use of the lithographic apparatus of FIG. 1 together with other apparatuses forming a production facility for semiconductor devices.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

The whole facility may be operated under control of a supervisory control system 238, which receives metrology data, design data, process recipes and the like. Supervisory control system 238 issues commands to each of the apparatuses to implement the manufacturing process on one or more batches of substrates.

Also shown in FIG. 2 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the metrology apparatus 240 can be used to maintain accurate performance of the patterning operations in the litho cluster, by control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

For the purposes of the present disclosure, another example of metrology apparatus 240 that is useful in calibrating the level sensor LS of the lithographic apparatus is an air gauge. This can be used, for example, to measure the real topography (height variations) on a representative sample of the substrates 232 prior to patterning by the lithographic apparatus. In other words, an air gauge sensor may be used as a process-independent measurement by which measurements from the optical sensor LS can be calibrated. A particular way of using such process-independent measurements will be disclosed below.

Figure 3:
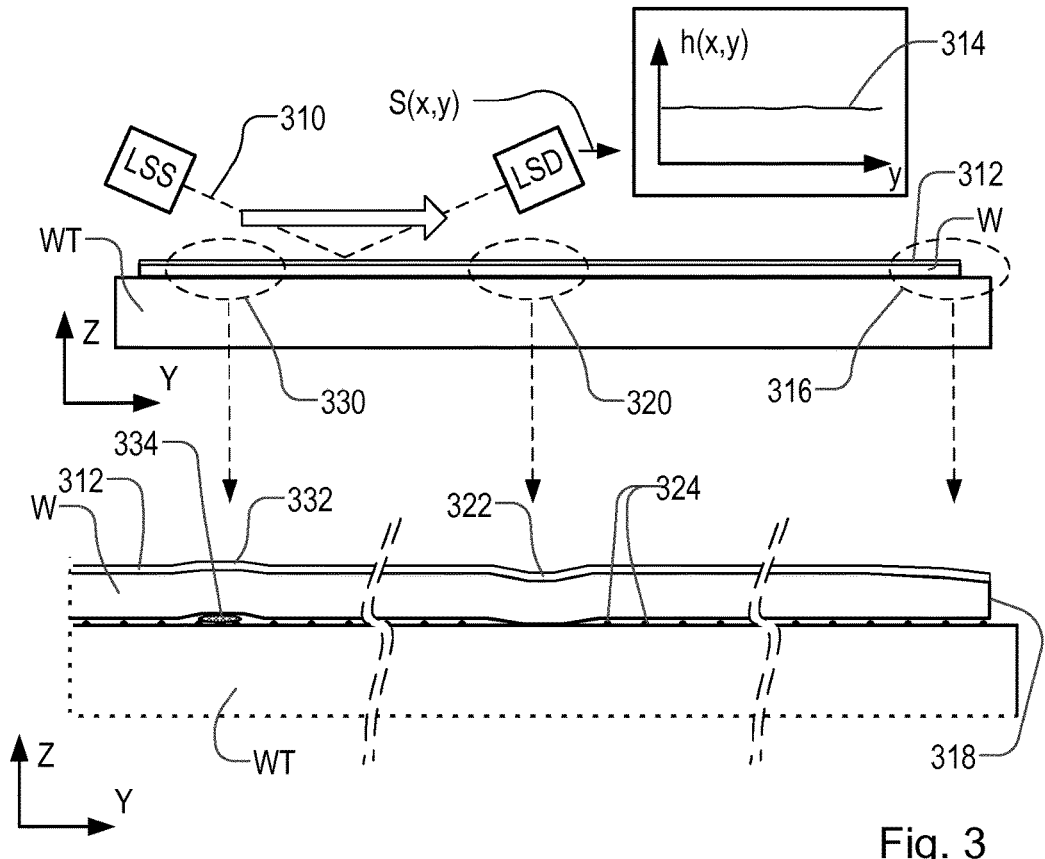
FIG. 3 illustrates schematically the operation of a height sensor and various topographical variations on an example substrate in the lithographic apparatus of FIG. 1, disregarding device-specific variations.

Referring now to FIG. 3, it was mentioned above that a preliminary step in the operation of a lithographic apparatus is for a map of substrate height to be obtained by measuring surface position in the Z direction against X-Y position. This height map may be obtained for example using the height sensor LS in the lithographic apparatus of FIG. 1, after the substrate has been clamped to one of the substrate supports WTa and WTb. The height map is used during patterning to achieve accurate focusing of an image of the patterning device MA onto the substrate. A substrate support is labeled WT, and carries a substrate W. The height sensor LS is in this example an optical sensor, comprising a source side optics LSS, and detector optics LSD.

In operation, source side optics LSS generates one or more beams of radiation (light) 310 that impinge onto a substrate W. Substrate W typically has different layers formed on it, and typically many more layers than are illustrated here. A top layer will normally be the resist layer 312 in which a pattern is to be formed. Below that will be an anti-reflective coating and below that will be potentially many layers of device features formed in different layouts and materials. The beam of light 310 is reflected by the substrate and detected by detector side optics LSD to obtain one or more signals S(x,y) from which a measurement of the surface height at a position (x,y) on the substrate can be derived. By measuring height at numerous positions across the substrate, a height map h(x,y) can be obtained by a suitable processor in control unit LACU. The height map contains the height data that is then used when the substrate is in the exposure station EXP, to control focus and other parameters in the operation of the lithographic apparatus. The details of these optics for height sensing, as well as the associated signal processing, are known in the art and described for example in the prior publications mentioned in the introduction. They will not be described herein in detail. The radiation used in the present examples may be monochromatic, polychromatic and/or broadband. It may be P- or S-polarized, circularly polarized and/or unpolarized.

The sensor signals and/or the resulting height map may be subject to various corrections before being used to control focusing. As mentioned, for example, calibrations may be applied based on process-independent measurements made using an air gauge or the like. Corrections to reduce process dependency can also be applied based on knowledge of the product design and processing. One method of doing this is described further in patent application WO2015/131969, mentioned above. Another method is disclosed in the present application, below. Combinations of these methods can be used, if desired.

The height map h(x,y) can take any suitable form. In a simple embodiment, the height map comprises a two-dimensional array of sample values indexed by the X and Y coordinates of position across the substrate. In other embodiments, the height values could be expressed by parametric curves, fitted to measured sample values. A graph 314 of h(x,y) in FIG. 3 represents height values in a single slice, for example extending in the Y direction with a certain X value.

Over most of the substrate surface, height variations are conventionally relatively gentle, both in extent and their degree of localization (spatial frequency). As seen in the enlarged detail at the bottom of FIG. 3, however, some different types of height anomalies can lead to localized topographical variations in a real process. For example, a steeper variation may arise in a region 316 towards the edge 318 of the substrate, in a peripheral region of the substrate.

In another region 320, a dip or hole 322 can be seen in the surface. This can have a number of causes. In a particular example, the hole may arise at a location where there is a gap in the pattern of projections known as burls 322, that typically support the back side of the substrate. A gap in the burl pattern may be necessary for example to allow an ejector pin, an air duct or some other actuator or sensor to be present on the surface of the substrate support. In another region 330, a bump feature 332 is seen in the surface. This also can have a number of causes. A common cause of bump features is contamination, shown here for example by a contaminant particle 334 trapped between the substrate W and substrate support WT.

Figure 4:
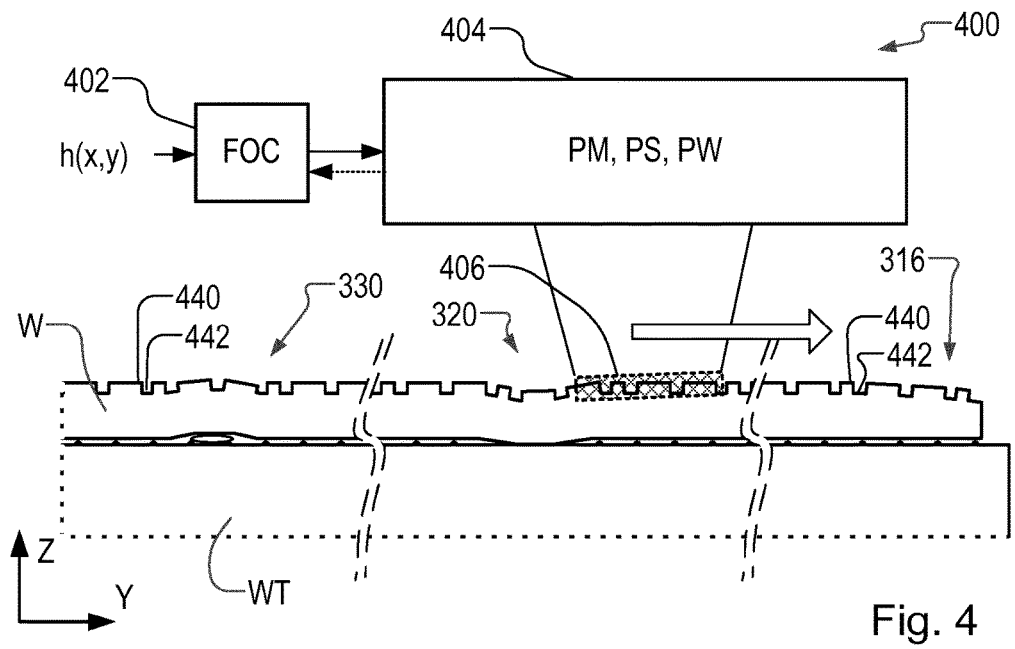
FIG. 4 is a schematic diagram of a focus control operation when applying a pattern to the substrate of FIG. 3, with the addition of device-specific topographic variations.

FIG. 4 illustrates focus control being performed on a substrate having height anomalies of the type described in FIG. 3, after substrate support WT with substrate W has been transferred to the exposure station EXP of the lithographic apparatus of FIG. 1. A focus control system 400 comprises a focus controller 402 (which may be implemented for example as a numerical process within lithographic apparatus control unit LACU) and the apparatus hardware 404. Hardware 404 in this example includes the various components of the positioners PM, PW and the projection system PS shown in FIG. 1. These components have associated sensors and actuators communicating with controller 402.

Using the height map h(x,y), controller 402 controls the relative positions of the substrate W, the projection system PS and the patterning device MA by a number of servo loops, so that an aerial image 406 of part of a field pattern is accurately focused in the resist layer 312 on substrate W. It will be understood that the one-dimensional cross-section of FIG. 4 is simplified. Assuming a conventional scanning mode of operation, aerial image 406 takes the form of a slit of radiation that extends in both X and Y directions, while forming the focused image in a plane illustrated in cross-section in FIG. 4. In a scanning mode of operation, typically the extent of the imaging slit will be much wider in the slit direction (X) than it is in the scanning direction (Y).

Referring still to FIG. 4, the substrate in this illustration still shows the edge, hole and bump anomalies in regions 316, 320 and 330. However, the substrate in this example also exhibits a strong device-specific topography. This is represented by high portions 440 and low portions 442 that appear in a regular pattern defined by the device layout. Different processing effects arise in the formation of different functional structures at different parts of the layout. A NAND or DRAM memory device for example will have large areas which contain arrays of memory cells, and peripheral areas containing logic circuits for reading, writing and general management of the memory.

Figure 5:
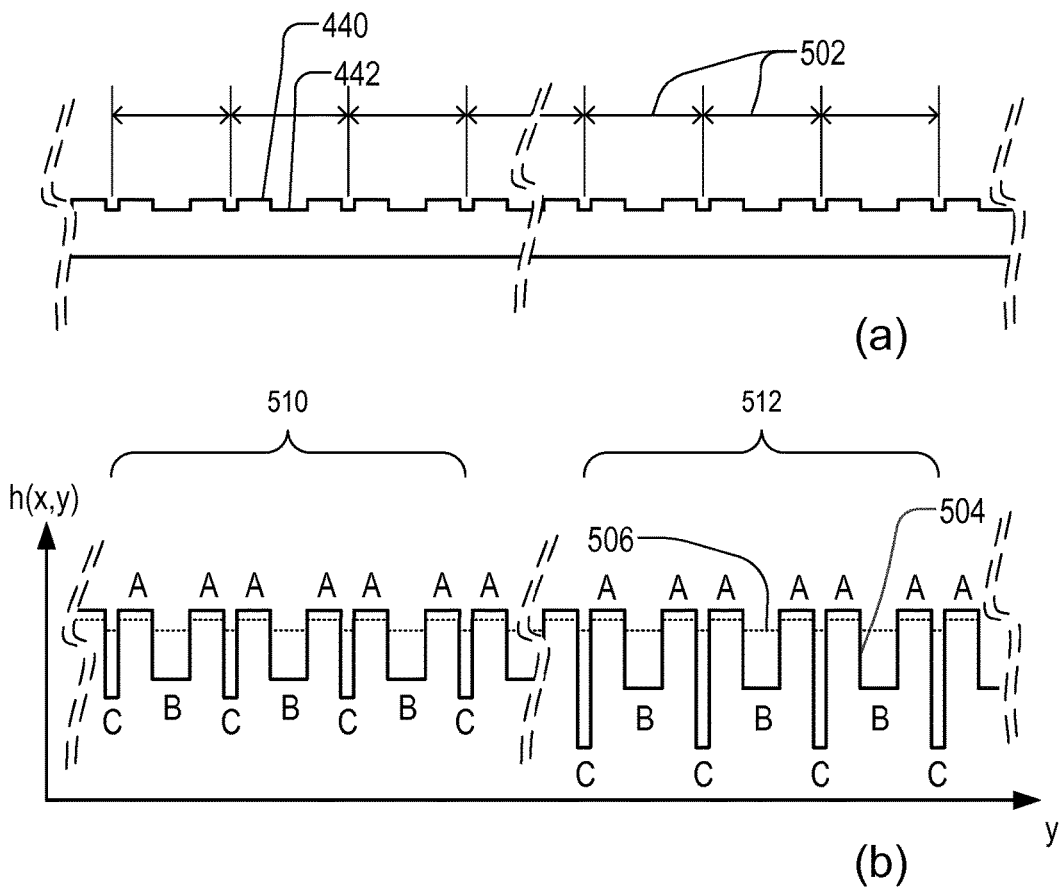
FIG. 5 illustrates (a) the device-specific topography at two regions of an example substrate and (b) height sensor data subject to process dependency variations between different portions within device areas and between different regions of the substrate.

FIG. 5 illustrates the contrast between (a) device-specific topography as it exists on the real substrate, and (b) the same device-specific topography as it may be perceived by the optical level sensor LS. Referring to the real topography (a), we see a repeating pattern of high portions 440 and low portions 442 within a series of device areas 502. Each device area may correspond for example one field of the pattern applied to the substrate, or several device areas 502 may be contained within a single field. At (b) trace 504 indicates the height sensor data on the same vertical scale as the real topography at (a). The steps in height between the higher portions and lower portions are represented in the height sensor data as being much larger than they are in the real topography. This is because the optical height sensor LS is calibrated for a particular material structure, and different parts of the layout contain very different materials which do not reflect the level sensor radiation 310 in the same way. The real topography is overlaid on the height sensor data trace 504 in the form of dotted line 506.

In the example, it is assumed that each device area 502 contains first areas A, second areas B and third areas C, each having different material properties. Three different types of areas are shown only by way of example, and in practice there may be only two types of area of concern. Comparing the height sensor data 504 with the real topography 506, it may be noticed that the relationship between the two in the first areas A is very consistent. By suitable calibration, measuring the true height with an air gauge, for example, height sensor data can be calibrated to represent accurately and consistently the true height of the substrate surface in these first areas. Typically, these first areas will be areas with a high portion of metal or "hard mask" material.

By contrast, in the second areas B and third areas C, the height sensor data 504 deviates greatly from the true topography 506, due to the different interaction of the height sensor radiation 310 with the materials in these areas. For the sake of illustration, different areas B and C are shown as having different degrees of process dependency. In the prior European application mentioned above, it is proposed to use prior knowledge of the design to apply different calibrations in these different areas, to obtain corrected level sensor data closer to the true topography. A particular difficulty arises, however, in that quite wide variations in the degree of process dependency can arise in different locations on the substrate. Accordingly, while certain process dependencies in areas B and C are observed in a region 510 in FIG. 5 (b), the process dependencies observed in another region 512 are very different.

To calibrate for these variations in process dependency across the substrate becomes very complicated. Furthermore, even within a single lot, quite wide variations in the degree of process dependency can arise between different substrates. Such variations cannot be addressed simply by calibration, as it is not practical in high-volume manufacture to measure the true topography of every substrate. Alternative height sensors, for example an optical height sensor using shorter wavelengths of radiation in the UV range offer reduced process dependency, and address the problem directly. However, there is a large installed base of lithographic apparatus is with conventional optical height sensors. It would be desirable if the performance of these apparatuses could be improved, without the expense of fitting new height sensor hardware.

Figure 6:
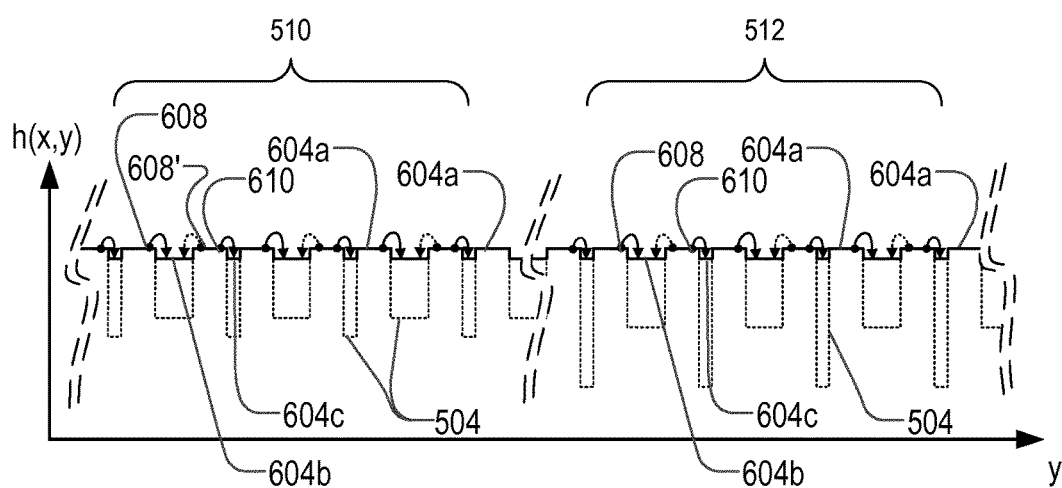
FIG. 6 illustrates a method of generating substitute height data using designated anchor areas in the example of FIG. 5.

FIG. 6 illustrates an alternative method of providing height data which overcomes the unpredictability of process dependency in some portions of device areas. This new method, height data 604 is generated by combining height sensor data 604a from areas A where the height sensor data is judged to be reliable, and substitute height data 604b and 604c in areas B and C where height sensor data 504 is judged to be unreliable. The substitute height data is generated by combining an expected device-specific topography with height sensor data from the first areas A. These areas may be regarded as "anchor areas", which are used as a reference from which substitute data for the intervening areas can be derived. The substitute data, even if it does not exactly match the real topography, is subject to less extreme process dependency, and less extreme variation of process dependency. Significant errors in height data can therefore be substantially eliminated.

In the illustrated example, anchor areas may be identified using prior knowledge of the layout and material properties of the substrate, according to the device design and process history. In other examples, the anchor areas may be identified by experiment, measuring a number of fields over a number of substrates, and noting those areas where the height sensor data reliably predicts the real surface height (comparing it with measurements obtained for example using an air gauge). Substitute height data 604b for one of the second areas may then be calculated for example by taking a measurement 608 at a point in an anchor area adjacent to the second area and combining it with prior knowledge defining an expected device-specific topography. For example, the height in a second area may be estimated by adding (or subtracting) an offset to (or from) the height measured at the adjacent anchor area. In the example having second areas B and third areas C, a different offset can be defined for each. Accordingly, a measurement 610 can be taken from the height sensor data for a first area A adjacent to one of the third areas C. Knowledge of the expected device-specific topography can be used to calculate substitute height data 604c. Notice that the offsets between the anchor point measurements 608 and 610 at the substitute height data is consistent between the regions 510 and 512, so that the substitute height data does not suffer from the variations that result from process variations and extreme process dependency in the height sensor data 504.

It will be appreciated that there may be a choice of measurements to be used as the reference for generating substitute height data in one of the second areas or third areas. Depending on the layout, the usable anchor areas may be few and far between. Different modifications of the method applicable in these circumstances will be described further below, with reference to FIGS. 9, 10 and 11.

Figure 7:
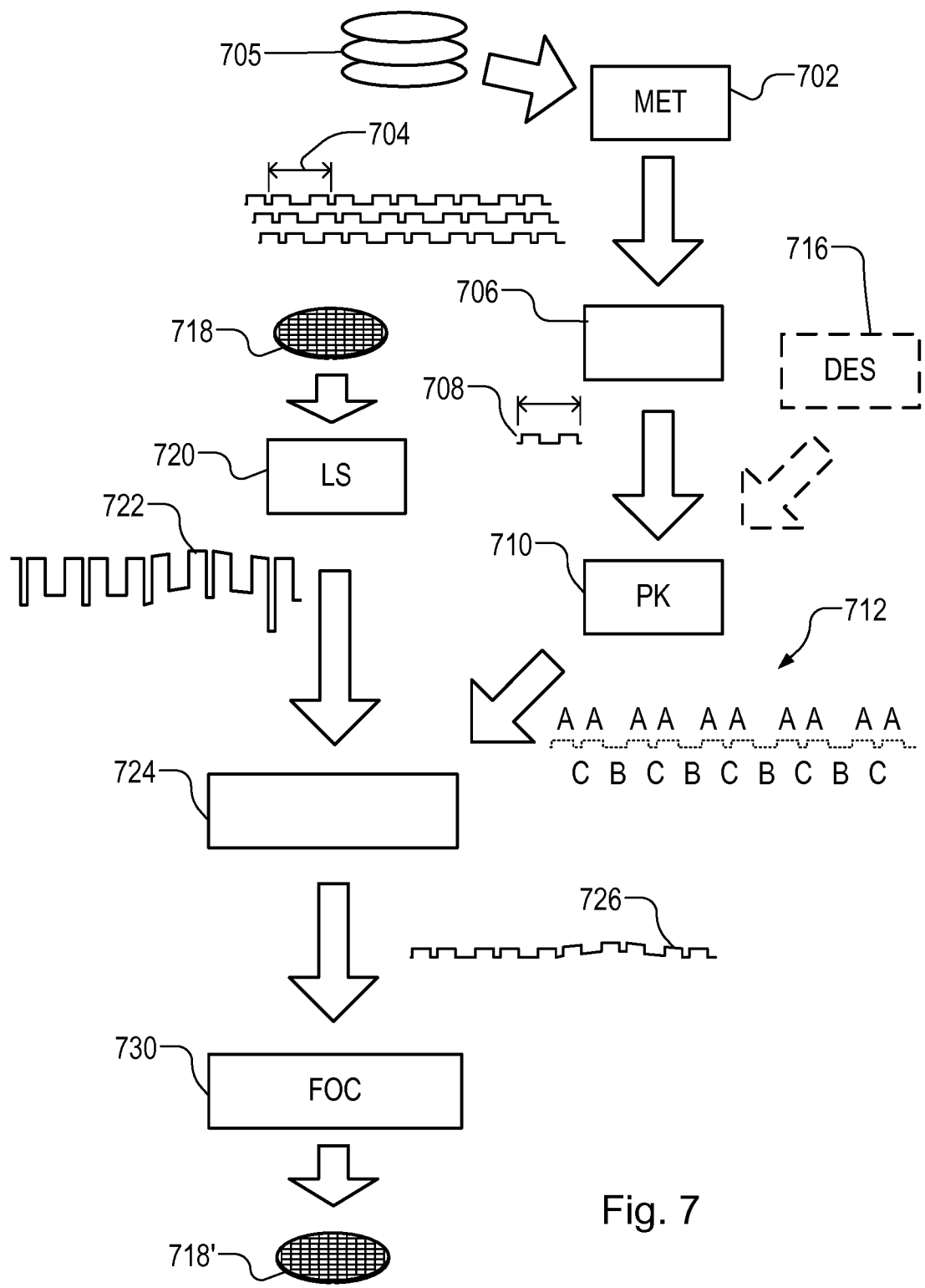
FIG. 7 is a flow diagram of the method of FIG. 6 being used to control a lithographic apparatus in accordance with an embodiment of the invention.

FIG. 7 is a flow diagram of a method of controlling a lithographic apparatus using the principles just explained in relation to FIG. 6. In a step 702, metrology apparatus such as an air gauge is used to measure the real topography of a statistically significant number of device areas 704 on a representative number of previously processed substrates 705. From this collection of data at step 706 in expected device-specific topography 708 is obtained. The expected device-specific topography 708 is effectively obtained by identifying a component of the topography that repeats between device areas (fields). A simple way to do this is to compare the measured topography of each field with a smoothed copy of the measured topography, and to take the average of the comparison result over a representative sample of the fields. In other words, an average field topography is obtained as a way of obtaining a representation of the topographical variations that are observed to be specific to the device pattern. The device specific topography can be regarded as a kind of intra-field fingerprint. As mentioned, the device areas may be the same as field areas, sub-areas within the field pattern.

Step 710, prior knowledge 712 is assembled using the expected device-specific topography 708 to define for example height offsets to be applied between anchor areas and other areas. Also in the prior knowledge 712 is a definition of the first areas (anchor areas) use in association with the defined height offsets. The identification of the first areas, as mentioned already, may be performed solely on the statistical properties of the measured topography 704. Alternatively, or in addition, layout knowledge from a design database 716 may be used to identify the anchor areas.

The prior knowledge 712 is then used with height sensor measurements to control the operation of the lithographic apparatus for one or more new substrates 718. In the context of the process illustrated in FIG. 2, substrate 718 may be one of the substrates 232 that has been subject already to patterning and processing of a number of device layers. At 720 after a substrate 718 is loaded into the lithographic apparatus, the height sensor LS of the apparatus is operated to obtain height sensor data 722. The height sensor data has the form of the height sensor data 504 in the example of FIGS. 5 and 6. The height sensor data represents both long-range and local distortions of the substrate itself, and the up and down steps of the device-specific topography. As seen in FIG. 5 (b), the sizes of the steps of the device-specific topography are exaggerated by the differences in process dependency between areas of the device layout, and are made unpredictable because of the variation of process dependency between different regions of the substrate.

At 724, the height sensor data 722 for the current substrate is combined with the prior knowledge 712 representing the expected device-specific topography, and identifying the anchor areas and other areas. For the other areas, substitute height data is calculated using the height sensor data 722 for the anchor areas. In principle, height data for the other areas could be calculated using a weighted combination of the measured height sensor data and the data from the anchor areas. However, in many examples, the height sensor data for the other areas will simply be judged unreliable and only the substitute height data will be used.

From step 724, a modified or synthesized height data 726 is generated, in which height values for the anchor areas are derived directly from height sensor data for those areas, and height values for the other areas are substitute height data, derived using the prior knowledge with the height sensor data for the neighboring anchor areas. At 730 the modified height data 726 is used in the focus control algorithm of the lithographic apparatus, to control positioning systems for the proper focusing of the aerial image, in the manner described above with reference to FIG. 4. The patterned substrate, now labeled 718', emerges from the lithographic apparatus, ready for development, etching and subsequent processing.

By use of the substitute height data in place of unreliable height sensor data, focusing of the aerial image (406 in FIG. 4) is more accurate than in conventional methods, and the quality and yield of devices on substrate 718' is consequently improved.

Figure 8:
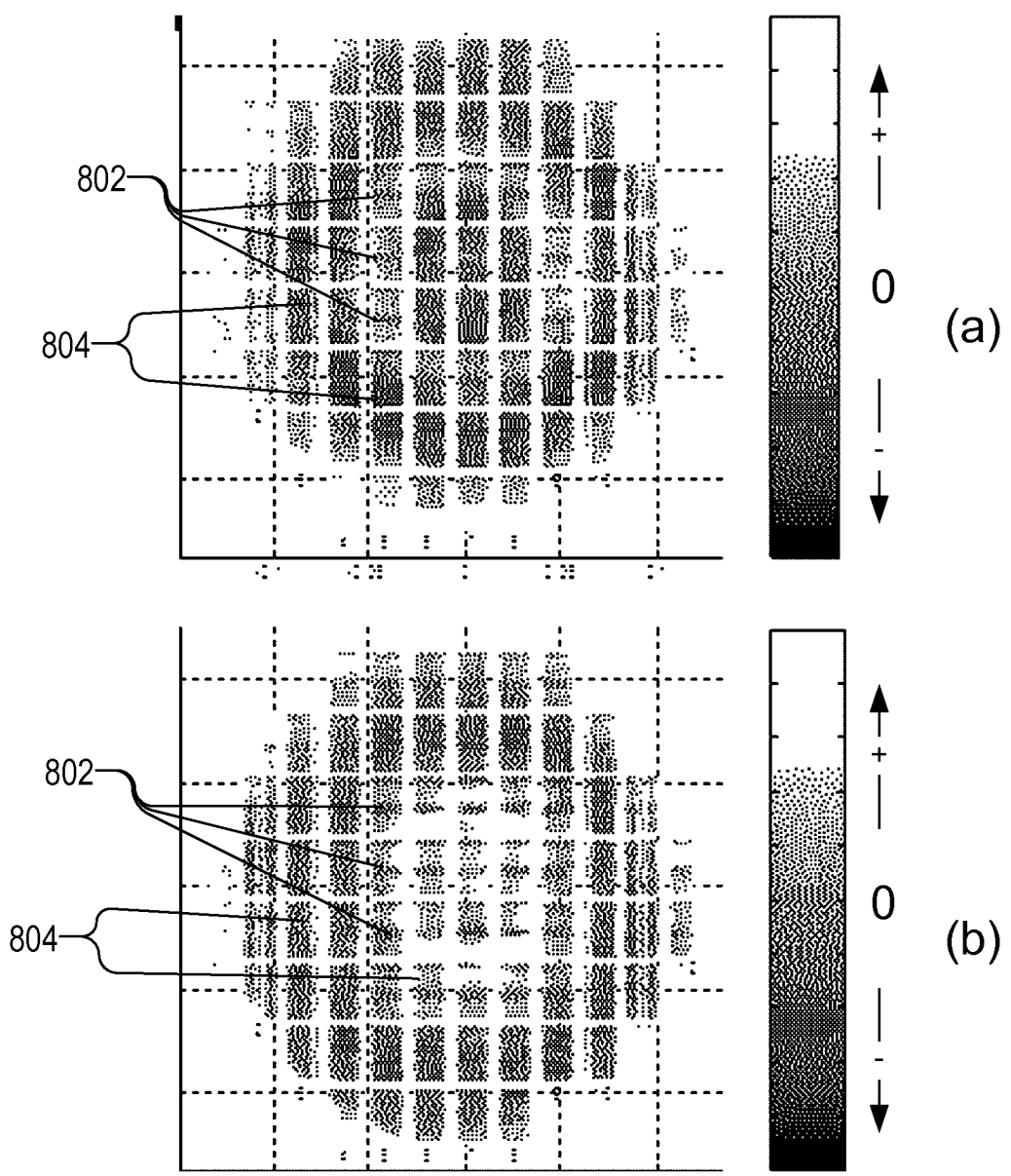
FIG. 8 illustrates variation in process dependency measured on example substrates, with identification of anchor areas.

FIG. 8 shows plots of measured height deviations over example wafers carrying a 3-D NAND device structure. The plots are provided only to show qualitative information, although the original colored plots provide quantitative information of course. Technologies like 3-D NAND can suffer from large process variations. Oxide layers may vary hundreds of nanometers between fields, wafers and lots. These variations occur on lithography non-critical layers, but these layers are underneath critical layers that are exposed after planarization. On these critical layers the height sensor radiation 310 interacts with the underlying layers. This leads to very large height sensor process dependency, sometimes on the order of tens of nanometers.

At (a) in FIG. 8, the mean variation over all wafers is plotted. At (b) the amplitude of variations between wafers is plotted. A mid-grey color indicates not zero process dependency, but average process dependency on this scale. Blacker and whiter regions indicate variation of process dependency. Scribe lanes 808 between device areas are shown white in the plots, simply because there is no measurement made there. Although the shade scale does not show the absolute scale of these variations, in the illustrated example, the amplitude of the wafer-to-wafer variation at (b) is around half of the mean inter-field variation at (a). In other words, these plots confirm that process dependency is a large effect, and variation of process dependency within wafers and between wafers is also a large effect. On the other hand, it can also be seen from the plots in FIG. 8 that there are certain areas 802 within the device patterns where process dependency and variation of process dependency are much lower than in other parts 804. In the 3-D NAND example illustrated, the skilled person will recognize that the areas with lower variability of process dependency are peripheral areas containing logic circuitry, while the areas of more extreme variability of process dependency are in the memory cell areas. These areas can be identified as first areas (anchor areas) and second areas (other areas) either from knowledge of the design process history, and/or from empirical observation based on plots such as the ones shown.

Figure 9:
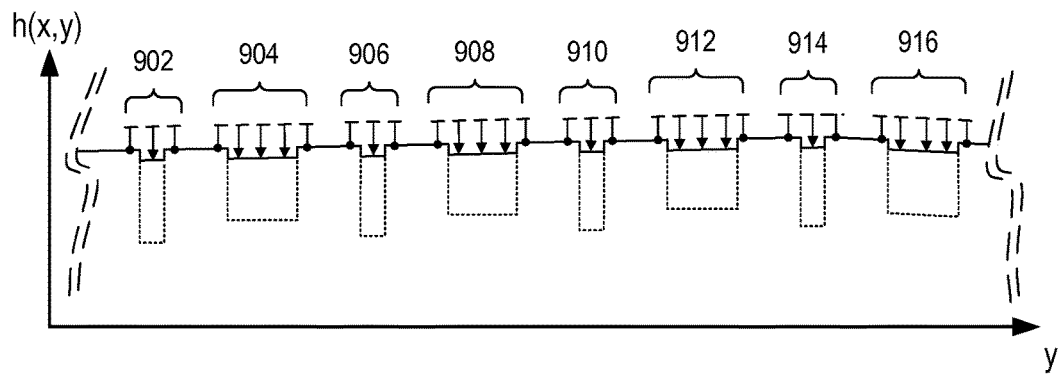
FIGS. 9, 10 and 11 illustrate different methods of calculating substitute height data that may be employed in embodiments of the invention.
Figure 10:
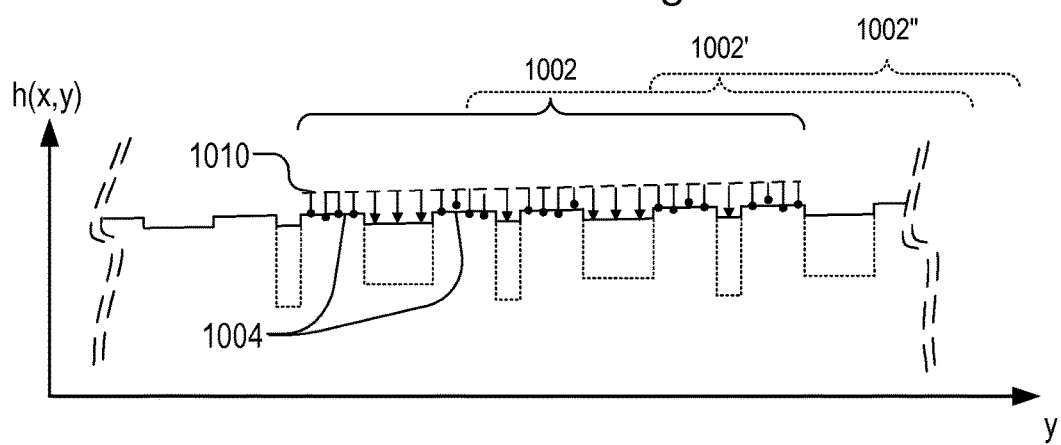
Figure 11:
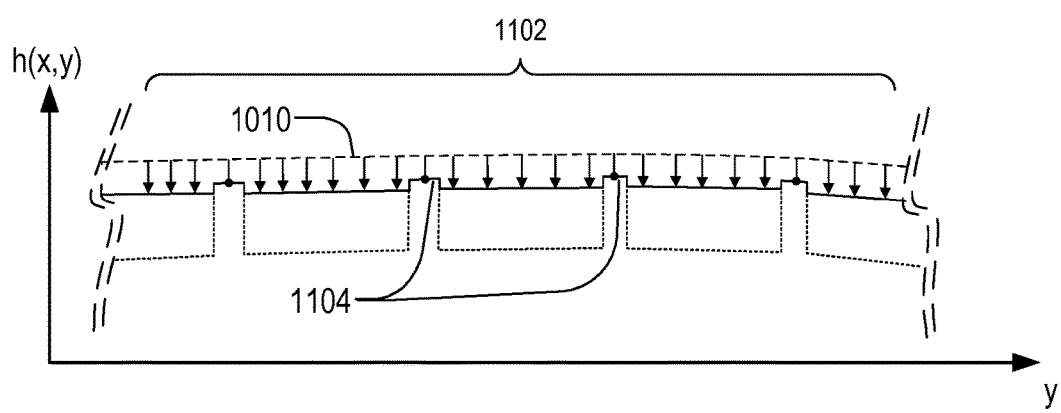

FIGS. 9, 10 and 11 illustrate variations in the method of calculating substitute height data from height sensor data in anchor areas. Recall that in FIG. 6, a simple method is described, in which a height measurement 608 from an adjacent anchor point is used to define the substitute height data 604b for an adjacent second area. Improvements on such a method can be made, for example to minimize the influence of measurement noise, and/or to reflect better the local and large-scale topography that underlies the device-specific topography.

In FIG. 9, each second or third area 902 to 916 has substitute height data generated by interpolation between anchor point measurements either side of the area. The anchor point measurements are illustrated by black circles. Interpolated substitute height data is indicated by arrowheads. A line or surface of interpolation is illustrated by a dashed line. This line is illustrated with an offset from the substrate surface height, purely to create space in the diagram. The interpolation may be linear interpolation in one or two dimensions. The anchor point measurements may be taken from a single measurement sample (pixel) in the height sensor data, or maybe an average of a few pixels. Only variation in the Y direction is illustrated here, with straight-line interpolation, but variation in the X direction can be calculated similarly. For interpolation across a two-dimensional area, a bicubic model, or an approximate plane model can be used, based on anchor point measurements around the periphery of the area. As can be seen from the rightmost area 916, the interpolation method is able to impart a slope across the second area, to reflect underlying topography.

FIG. 10 illustrates a variation in which an interpolation area 1002 extends across several anchor areas and other areas, which may be useful to reduce the influence of random noise in individual height samples (pixels). The anchor point measurements can be seen to vary up and down randomly from the true surface height. These random variations are averaged out, by deriving an interpolation line or surface 1010. The interpolation area 1002 can be implemented as a moving window, with successive areas 1002', 1002" overlapping as shown. (It will be understood that the filtering of random noise by averaging over a larger interpolation area comes at the expense of response to local anomalies such as the ones illustrated in FIG. 4.)

FIG. 11 illustrates another variation in which an interpolation area 1102 extends over several anchor areas 1104. The interpolation area one 102 may not be very large, but the available anchor areas 1104 are very small and an interpolation line or surface 1110 is fitted to a number of measurements at different areas 1104, to capture the underlying topography without undue susceptibility to noise. Alternatively, the interpolation area 1102 may extend across the whole substrate, and a suitable parametric model such as a polynomial or radial fit model can be used to describe the inter-field topography from which substitute height data will be calculated.

Figure 12:
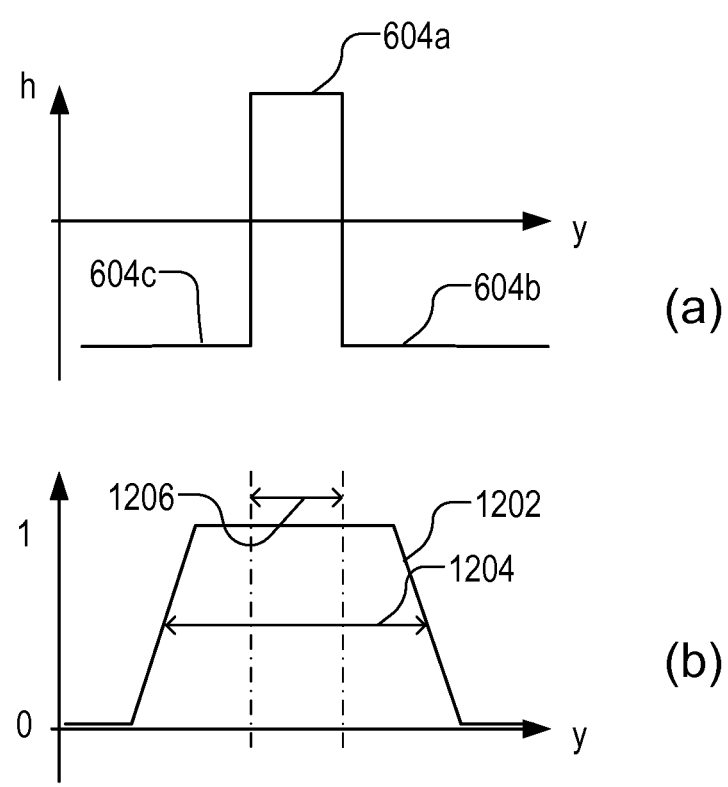
FIG. 12 illustrates a relationship between (a) a local topographic variation and (b) a height sensor response function, when an anchor area is very small.

FIG. 12 illustrates a refinement of the method that may be applied when anchor areas are found to be very small, and smaller than a measurement spot of the height sensor. Two graphs (a) and (b) are shown, all having the same horizontal scale. FIG. 12 (a) illustrates a real topography having an anchor area 604a and other areas 604b and 604c on either side of it. In FIG. 12 (b) line 1202 shows a spatial response function f of the height sensor LS in an example lithographic apparatus. Notice that the effective width 1204 of the spatial response function is much wider than the width 1206 of the physical feature that provides the anchor area 604a. Consequently, the height sensor LS in operation does not "see" the true height of the narrow anchor area. In such a case, height sensor data 504 for the anchor area also contains height information from the non-anchor areas, which is process dependent. Because of this, the height measurement on the anchor area also becomes process dependent and susceptible for process dependency variations over the substrate. In order to calculate substitute height data to be used in the areas 604b and 604c, a true height of the anchor area 604a should be used together with the known height differences.

Accordingly, in one embodiment, the method of FIG. 7 applies a deconvolution of the height sensor data 504 with the (assumed) height sensor response function 1202. Doing this, a refined height sensor data can be obtained. As can be seen, this deconvolved height sensor data more accurately captures the true height of features that are smaller than the spatial resolution of the height sensor.

In conclusion, by calculating substitute height data to be used in areas where height sensor data is known to be unreliable, height data more accurately representing the true device-specific topography can be provided for use in focus control. The techniques disclosed herein can be used by themselves, or in combination with other techniques, for improving the accuracy and utility of height data for use in controlling the lithographic apparatus. The skilled person after consideration of the present disclosure will be able to adapt the teaching as appropriate to different types of height sensor data, and different product designs and processes.

On a real substrate, the amplitude of the true device-specific topography may vary slightly over the substrate area. It is a matter of design choice whether the device-specific topography is assumed, as an approximation, to be constant over the whole substrate, or whether, as an alternative, the variation in amplitude is captured in the prior knowledge 712 and used to improve the accuracy of the combined height data 726. Although the variation in amplitude may be small over most of the substrate area, in some cases device-specific topography may become accentuated in the peripheral fields. In such a case, a radial fit model may be used to modify the height differences used for generation of the substitute height data.

There are provided embodiments according the following clauses:

1. A method of controlling a lithographic apparatus to manufacture one or more devices on a substrate, the method comprising:

(a) using a height sensor to obtain height sensor data representing a topographical variation across the substrate; and (b) using the height sensor data to control a positioning system of the lithographic apparatus for applying a device pattern at multiple locations across the substrate wherein step (b) comprises:

(b1) identifying one or more first areas where the height sensor data is judged to be reliable and one or more second areas where the height sensor data is judged to be less reliable;

(b2) calculating substitute height data for the one or more second areas using the height sensor data for the first areas together with prior knowledge of expected device-specific topography, and (b3) controlling the lithographic apparatus using a combination of the height data from the sensor and the substitute height data.

2. A method as provided in clause 1, wherein in step (b1) the first areas and second areas are identified at least partly using knowledge of a product layout.

3. A method as provided in clause 1 or clause 2, wherein in step (b1) the first areas and second areas are identified at least partly using measurements made on prior substrates.

4. A method as provided in any of clauses 1 to 3, wherein in step (b2) the prior knowledge of expected device-specific topography specifies a height difference between a first area and a neighboring second area.

5. A method as provided in clause 4, wherein the substitute height data for one second area is calculated using the specified height difference together with height sensor data for one or more first areas immediately neighboring the second area.

6. A method as provided in clause 4, wherein the substitute height data for one second area is calculated using the specified height difference together with a height model calculated from height sensor data for a plurality of first areas and not only first areas immediately neighboring the second area.

7. A method as provided in any of clauses 1 to 6, wherein in step (b2) the height sensor data for a first area is enhanced by deconvolution with a height sensor response function, prior to being used to calculate the substitute height data for a second area.

8. A lithographic apparatus comprising a projection system and positioning system for positioning a patterning device and substrate in relation to the projection system for applying a pattern to a substrate, the lithographic apparatus including:
  a height sensor for obtaining height sensor data representing a topographical variation across the substrate; and
  a controller for using the height sensor data to control the positioning system, wherein the controller is arranged (i) to identify one or more first areas where height sensor data is judged to be reliable and one or more second areas where the height sensor data is judged to be less reliable, (ii) to calculate substitute height data for the second areas using height sensor data for the first areas together with prior knowledge of expected device-specific topography, and (iii) to use a combination of the height data from the sensor and the substitute height data when controlling the positioning system.

9. A lithographic apparatus as provided in clause 8, wherein the controller is arranged to identify the first areas and second areas at least partly using knowledge of a product layout.

10. A lithographic apparatus as provided in clause 8 or clause 9, wherein the controller is arranged to identify the first areas and second areas at least partly using measurements made on prior substrates.

11. A lithographic apparatus as provided in any of clauses 8 to 10, wherein the prior knowledge of expected device-specific topography specifies a height difference between a first area and a neighboring second area.

12. A lithographic apparatus as provided in clause 11, wherein the controller is arranged to calculate the substitute height data for one second area using the specified height difference together with height sensor data for one or more first areas immediately neighboring the second area.

13. A lithographic apparatus as provided in clause 11, wherein the controller is arranged to calculate the substitute height data for one second area using the specified height difference together with a height model calculated from height sensor data for a plurality of first areas and not only first areas immediately neighboring the second area.

14. A lithographic apparatus as provided in any of clauses 1 to 13, wherein the controller is arranged to enhance the height sensor data for a first area by deconvolution with a height sensor response function, prior to calculating the substitute height data for a second area.

15. A lithographic apparatus comprising a projection system and positioning system for positioning a patterning device and substrate in relation to the projection system for applying a pattern to a substrate, the lithographic apparatus being arranged to control the positioning system by a method as provided in any of clauses 1 to 7.

16. A computer program product comprising machine readable instructions for causing a general purpose data processing apparatus to perform the steps of a method as provided in any of clauses 1 to 7.

17. A computer program product comprising machine readable instructions for causing a general purpose data processing apparatus to implement the controller of a lithographic apparatus as provided in any of clauses 8 to 14.

18. A method of controlling a lithographic apparatus to manufacture one or more devices on a substrate, the method comprising:
  (a) obtaining height sensor data representing a topographical variation across the substrate; and
  (b) using the height sensor data to control a positioning system of the lithographic apparatus for applying a device pattern at a location on the substrate wherein the method further comprises:
    (b1) identifying one or more first areas of the substrate where the height sensor data is judged to be reliable and one or more second areas of the substrate where the height sensor data is judged to be less reliable;
    (b2) determining substitute height data for the one or more second areas using the height sensor data for the one or more first areas, and
    (b3) controlling the lithographic apparatus using a combination of the height data and the substitute height data.

19. A lithographic apparatus comprising a projection system and positioning system for positioning a patterning device and substrate in relation to the projection system for applying a pattern to a substrate, the lithographic apparatus including:
  a height sensor for obtaining height sensor data representing a topographical variation across the substrate; and
  a control system configured to use the height sensor data for controlling the positioning system, wherein
    the control system is arranged
      (i) to identify one or more first areas where the height sensor data is judged to be reliable and one or more second areas where the height sensor data is judged to be less reliable,
      (ii) to determine substitute height data for the one or more second areas using the height sensor data for the one or more first areas, and
      (iii) to use a combination of the height data and the substitute height data when controlling the positioning system.

Numerous further variations of the above examples can be envisaged within the scope of the present disclosure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The descriptions above are intended to be illustrative, not limiting. Thus, it will be apparent to one skilled in the art that modifications may be made to the invention as described without departing from the spirit and scope of the claims set out below. In addition, it should be appreciated that structural features or method steps shown or described in any one embodiment herein can be used in other embodiments as well.

The invention claimed is:

1. A method of controlling a lithographic apparatus to manufacture one or more devices on a substrate, the method comprising:
   obtaining height sensor data representing a topographical variation across the substrate;
   identifying one or more first areas of the substrate where the height sensor data is judged to be reliable and one or more second areas of the substrate where the height sensor data is judged to be less reliable;
   determining substitute height data for the one or more second areas using the height sensor data for the one or more first areas together with prior knowledge of expected device-specific topography that specifies a height difference between a first area and a neighboring second area; and
   controlling the lithographic apparatus using a combination of the height data and the substitute height data for applying a device pattern at a location on the substrate.

2. The method as claimed in claim 1, wherein the one or more first areas and one or more second areas are identified at least partly using knowledge of a product layout.

3. The method as claimed in claim 1, wherein the one or more first areas and one or more second areas are identified at least partly using measurements made on prior substrates.

4. The method as claimed in claim 1, wherein the substitute height data for one second area is calculated using the specified height difference together with height sensor data for one or more first areas immediately neighboring the second area.

5. The method as claimed in claim 1, wherein the substitute height data for one second area is calculated using the specified height difference together with a height model calculated from height sensor data for a plurality of first areas and not only first areas immediately neighboring the second area.

6. The method as claimed in claim 1, wherein the height sensor data for a first area is enhanced by deconvolution with a height sensor response function, prior to being used to determine the substitute height data for a second area.

7. A lithographic apparatus comprising a projection system and a positioning system configured to position a patterning device and a substrate in relation to the projection system for applying a pattern to the substrate, the lithographic apparatus including:
   a height sensor configured to obtain height sensor data representing a topographical variation across the substrate; and
   a control system configured to use the height sensor data to control the positioning system, wherein the control system is arranged (i) to identify one or more first areas where height sensor data is judged to be reliable and one or more second areas where the height sensor data is judged to be less reliable (ii) to determine substitute height data for the one or more second areas using height sensor data for the one or more first areas together with prior knowledge of expected device-specific topography that specifies a height difference between a first area and a neighboring second area, and (iii) to use a combination of the height data and the substitute height data when controlling the positioning system.

8. The lithographic apparatus as claimed in claim 7, wherein the control system is arranged to identify the one or more first areas and one or more second areas at least partly using knowledge of a product layout.

9. The lithographic apparatus as claimed in claim 7, wherein the control system is arranged to identify the one or more first areas and one or more second areas at least partly using measurements made on prior substrates.

10. The lithographic apparatus as claimed in claim 7, wherein the control system is arranged to calculate the substitute height data for one second area using the specified height difference together with height sensor data for one or more first areas immediately neighboring the second area.

11. The lithographic apparatus as claimed in claim 7, wherein the control system is arranged to calculate the substitute height data for one second area using the specified height difference together with a height model calculated from height sensor data for a plurality of first areas and not only first areas immediately neighboring the second area.

12. The lithographic apparatus as claimed in claim 7, wherein the control system is arranged to enhance the height sensor data for a first area by deconvolution with a height sensor response function, prior to calculating the substitute height data for a second area.

13. A non-transitory computer program product comprising machine readable instructions therein, the instructions configured, upon execution by a data processing apparatus, to cause the data processing apparatus to at least:
   obtain height sensor data representing a topographical variation across a substrate;
   identify one or more first areas of the substrate where the height sensor data is judged to be reliable and one or more second areas of the substrate where the height sensor data is judged to be less reliable;
   determine substitute height data for the one or more second areas using the height sensor data for the one or more first areas together with prior knowledge of expected device-specific topography that specifies a height difference between a first area and a neighboring second area; and
   control a lithographic apparatus using a combination of the height data and the substitute height data for applying a device pattern at a location on the substrate.

14. A non-transitory computer program product having machine readable instructions therein, the instructions configured, upon execution by a data processing system, to cause the data processing system to at least:
   obtain height sensor data representing a topographical variation across a substrate;
   identify one or more first areas of the substrate where the height sensor data is judged to be reliable and one or more second areas of the substrate where the height sensor data is judged to be less reliable;
   enhance height sensor data for one or more first areas by deconvolution of that data with a height sensor response function;
   determine substitute height data for the one or more second areas using the enhanced height sensor data for the one or more first areas; and
   control the lithographic apparatus using a combination of the height data and the substitute height data for applying a device pattern at a location on the substrate.

15. The computer program product as claimed in claim 14, wherein the one or more first areas and one or more second areas are identified at least partly using knowledge of a product layout.

16. The computer program product as claimed in claim 14, wherein the one or more first areas and one or more second areas are identified at least partly using measurements made on prior substrates.

17. The computer program product as claimed in claim 13, wherein the height sensor data for a first area is enhanced by deconvolution with a height sensor response function, prior to being used to determine the substitute height data for a second area.

18. The computer program product as claimed in claim 13, wherein the one or more first areas and one or more second areas are identified at least partly using knowledge of a product layout.

19. The computer program product as claimed in claim 13, wherein the substitute height data for one second area is calculated using the specified height difference together with height sensor data for one or more first areas immediately neighboring the second area.

20. The computer program product as claimed in claim 13, wherein the substitute height data for one second area is calculated using the specified height difference together with a height model calculated from height sensor data for a plurality of first areas and not only first areas immediately neighboring the second area.

* * * * *